(12) United States Patent
Han et al.

(10) Patent No.: US 9,704,972 B2
(45) Date of Patent: Jul. 11, 2017

(54) SEMICONDUCTOR STRUCTURES AND FABRICATION METHOD THEREOF

(71) Applicant: Semiconductor Manufacturing International (Shanghai) Corporation, Shanghai (CN)

(72) Inventors: Qiuhua Han, Shanghai (CN); Jie Chen, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 28 days.

(21) Appl. No.: 14/865,052

(22) Filed: Sep. 25, 2015

(65) Prior Publication Data

US 2016/0093718 A1   Mar. 31, 2016

(30) Foreign Application Priority Data

Sep. 26, 2014   (CN) .......................... 2014 1 0504707

(51) Int. Cl.
| | |
|---|---|
| *H01L 29/66* | (2006.01) |
| *H01L 29/78* | (2006.01) |
| *H01L 21/265* | (2006.01) |
| *H01L 29/49* | (2006.01) |
| *H01L 29/165* | (2006.01) |

(52) U.S. Cl.
CPC ...... *H01L 29/66636* (2013.01); *H01L 21/265* (2013.01); *H01L 29/4983* (2013.01); *H01L 29/6656* (2013.01); *H01L 29/6659* (2013.01); *H01L 29/66492* (2013.01); *H01L 29/7834* (2013.01); *H01L 29/7848* (2013.01); *H01L 29/165* (2013.01)

(58) Field of Classification Search
CPC ......... H01L 29/66636; H01L 29/66492; H01L 29/7848
See application file for complete search history.

(56) References Cited

U.S. PATENT DOCUMENTS

| | | | |
|---|---|---|---|
| 8,741,723 B2* | 6/2014 | Chi ....................... | H01L 29/665 438/299 |
| 2008/0233746 A1* | 9/2008 | Huang ................ | H01L 21/0337 438/689 |
| 2011/0171804 A1* | 7/2011 | Wang .............. | H01L 21/823807 438/302 |

(Continued)

*Primary Examiner* — Daniel Luke
*Assistant Examiner* — Khatib Rahman
(74) *Attorney, Agent, or Firm* — Anova Law Group, PLLC

(57) ABSTRACT

A method is provided for fabricating transistors. The method includes providing a semiconductor substrate. The substrate has a gate film and a mask film formed on a top surface. The mask film contains implanted carbon ions. The method further includes forming a mask layer by etching the mask film and then forming a gate layer by etching through the gate film using the mask layer as a mask until the substrate is exposed. The method also includes forming a first sidewall containing implanted carbon ions on the side surface of the gate layer and the mask layer; forming a stress layer in the substrate on both sides of the gate layer and the first sidewall; and forming a source region on one side of the gate layer and the first sidewall and a drain region on the other side of the gate layer and the first side wall.

20 Claims, 6 Drawing Sheets

(56) References Cited

U.S. PATENT DOCUMENTS

2012/0202326 A1* 8/2012 Kronholz .......... H01L 21/31111
 438/231
2012/0309150 A1* 12/2012 Zhang ............... H01L 21/26506
 438/285

* cited by examiner

SEMICONDUCTOR STRUCTURES AND FABRICATION METHOD THEREOF

CROSS-REFERENCES TO RELATED APPLICATIONS

This application claims the priority of Chinese patent application No. 201410504707.6, filed on Sep. 26, 2014, the entirety of which is incorporated herein by reference.

FIELD OF THE INVENTION

The present invention generally relates to the field of semiconductor manufacturing technology and, more particularly, relates to semiconductor transistors and fabrication processes thereof.

BACKGROUND

With the rapid development of semiconductor manufacturing technology, semiconductor devices are now moving towards the direction of higher element density and higher integration degree. As the most fundamental semiconductor device, transistor is currently being widely used. Along with the improvement of the element density and the integrity of semiconductor devices, the dimensions of the gate in transistors thus become much shorter than in the past. However, a shorter gate in a transistor may cause short channel effect, thus leads to a leakage current in the transistor and eventually affects the electrical properties of the semiconductor device. Currently, improving the properties of semiconductor devices in the present technology is mainly through the improvement of the mobility of carriers. As the mobility of carriers increases, the driving current of the transistor increases, thus the leakage current in the transistor decreases. Furthermore, a key factor to improve the mobility of carriers is to increase the stress in the channel region of the transistor, therefore improving the stress in the channel region of a transistor may significantly improve the performance of the transistor.

An existing method to improve the stress in the channel region of a transistor is to form a stress layer in the source region and the drain region of the transistor. Specifically, the stress layer in a p-type metal-oxide semiconductor (PMOS) transistor may be made of SiGe. Because SiGe and Si have the same lattice structure, i.e., the 'diamond' structure, and, at room temperature, the lattice constant of SiGe is larger than that of Si there is a lattice mismatch between Si and SiGe. Such a lattice mismatch ensures that the stress layer provides compressive stress in the channel region and further improves the mobility of the carriers in the channel region of the PMOS transistor. Accordingly, the stress layer in an n-type metal-oxide semiconductor (NMOS) transistor may be made of SiC. At room temperature, the lattice constant of SiC is smaller than that of Si, therefore the lattice mismatch between Si and SiC leads to tensile stress in the channel region and further improves the performance of the NMOS transistor.

However, for transistors fabricated by using the existing method with a stress layer formed in the source region and the drain region, the structural appearance of the transistor may be poor and the performance may be unstable. Specifically, following an existing method, EPI particles, also known as mushroom defects, are often formed on the surface of the semiconductor device close to the gate, which may cause a leakage current on the top of the gate layer or the subsequently-formed metal gate. Thus, the performance of the transistor may be unstable, the reliability may be low, and the yield may also decrease.

The disclosed methods and structures are directed to solve one or more problems set forth above and other problems.

BRIEF SUMMARY OF THE DISCLOSURE

The present disclosure includes a method for fabricating a transistor. Specifically, the disclosed method includes providing a semiconductor substrate. The substrate has a gate film and a mask film formed on a top surface. The mask film contains implanted carbon ions. The method further includes forming a mask layer by etching the mask film and then forming a gate layer by etching through the gate film using the mask layer as a mask until the substrate is exposed. The method also includes forming a first sidewall containing implanted carbon ions on the side surface of the gate layer and the mask layer; forming a stress layer in the substrate on both sides of the gate layer and the first sidewall; and forming a source region on one side of the gate layer and the first sidewall and a drain region on the other side of the gate layer and the first sidewall.

The present disclosure also includes a structure of transistor. The structure of transistor includes a semiconductor substrate having a gate dielectric layer, a gate layer, and a mask layer on a top surface of the substrate and a first sidewall on the side surface of the gate dielectric layer, the gate layer, and the mask layer. Both the mask layer and the first sidewall contain implanted carbon ions. The structure of transistor may also include a second sidewall and the second sidewall may or may not contain implanted carbon ions. The structure of transistor also includes a stress layer formed in the substrate on both sides of the gate layer and the first sidewall. The surface of the substrate away from the gate layer, the first sidewall, and the stress layer is lightly doped. The structure of transistor also has a source region formed on one side of the gate layer and the first sidewall and a drain region formed on the other side of the gate layer and the first sidewall.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In current technology, a stress layer may be formed in both the source region and the drain region of a transistor to improve the mobility of carriers in the channel region thus avoid the short channel effect as the dimensions of the transistor become shorter than in the past.

Figure 1:
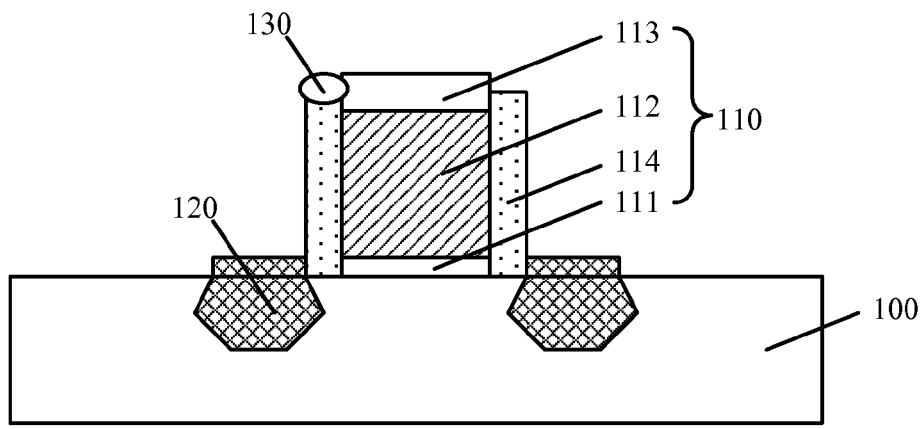
FIG. 1 illustrates a cross-section view of a transistor of an existing method.

FIG. 1 illustrates a cross-section view of a transistor of an existing method. As shown in FIG. 1, the structure of the transistor includes a substrate 100 with a gate structure 110 on a top surface of the substrate 100. The gate structure 110 consists of a gate dielectric layer 111 formed on the top surface of the substrate 100, a gate layer 112 formed on the surface of the gate dielectric layer 111, a mask layer 113 formed on the top of the gate layer 112, and a sidewall 114 formed on the side surface of the gate dielectric layer 111, the gate layer 112, and the mask layer 113. The structure of the transistor further includes a stress layer 120 formed in the substrate 100 and on both sides of the gate structure 110.

The gate layer 112 is made of polycrystalline silicon, and the gate layer 112 can be formed as a gate of the transistor or as a dummy gate. When the gate layer 112 is formed as a dummy gate, the dummy gate is used to pre-occupy the space for a subsequently-formed metal gate.

Referring to FIG. 1, the process to form the stress layer 120 includes: after forming the gate structure 110 on the surface of the substrate 100, forming openings in the substrate 100 on both sides of the gate structure 110 and then forming the stress layer 120 to fill the openings by using a selective epitaxial deposition process. When the transistor is a PMOS transistor, the stress layer 120 is made of SiGe; when the transistor is an NMOS transistor, the stress layer 120 is made of SiC. In either situation, the lattice mismatch between the semiconductor EPI material of the stress layer 120 and the silicon substrate 100 results in stress in the channel region under the gate layer 112, thus enhancing the mobility of carriers in the transistor and avoids the short channel effect.

As the dimensions of the semiconductor device decrease, the mask (not shown) used to form the openings and then the stress layer 120 may expose not only the portion of the surface of the substrate 100 required to form the openings and the stress layer 120 at both sides of the gate structure 110, but also the gate structure 110. Referring to FIG. 1, within the gate structure 110, the top surface of the gate layer 112 is expected to be protected by the mask layer 113 and the side surface of the gate layer 112 is expected to be protected by the sidewall 114. During the formation of the openings in the substrate 100 on both sides of the gate structure 110, a relatively large exposed area by the mask may ensure the accuracy of the photolithography process in forming the mask layer 113, thus the dimension and the shape of the exposed area of the mask can be accurate.

However, in the course of forming the stress layer 120 by using the selective epitaxial deposition process, because the mask used to define the openings formed in the substrate 100 may also expose the gate structure 110, while the thickness of the mask layer 113 and the thickness of the sidewall 114 may both decrease as the dimension of the semiconductor device decreases, the process gas used to form the stress layer 120 likely diffuse into the mask layer 113 and the sidewall 114 and further contact with the gate layer 112 made of polycrystalline silicon. Therefore, the selective epitaxial deposition process not only forms the stress layer 120 in the openings but also forms EPI particles 130 on the top surface of the mask layer 113 and the side surface of the sidewall 114. The EPI particles 130 are also known as mushroom defects. Specifically, the EPI particles 130 are likely formed on the top surface of the sidewall 114 next to the mask layer 113. Because EPI particles are made of semiconducting materials, they may cause a leakage current on the top of the gate layer 112 or on the top of a subsequently-formed metal gate, thus the performance of the transistors is not stable, the reliability becomes worse, and the yield rate also decreases.

In view of the problem described above, the present invention provides a method to form transistors. In the disclosed method, a mask layer containing implanted carbon ions is used as a mask in a subsequent etching process to form a gate layer. In addition, after the formation of the gate layer by etching, a first sidewall is formed on the side surface of a gate layer and a mask layer. The first sidewall is also implanted with carbon ions. The bonding energy between carbon ions and semiconductor ions is relatively strong, therefore during the formation of the stress layer, when semiconductor ions in the process gas enter the mask layer and the first sidewall, the semiconductor ions are preferentially bonded, to the carbon ions. Thus, the problem that the semiconductor ions penetrate through the mask layer and the first sidewall and further react with the gate layer may be avoided. As a result, the probability to form EPI particles on the top surface of the mask layer and the surface of the first sidewall may also be diminished. Therefore, the structural appearance of the transistor may be desired, the leakage current of the transistor may be avoided, the performance of the transistor may be stable, and the reliability of the transistor may also be improved.

Figure 14:
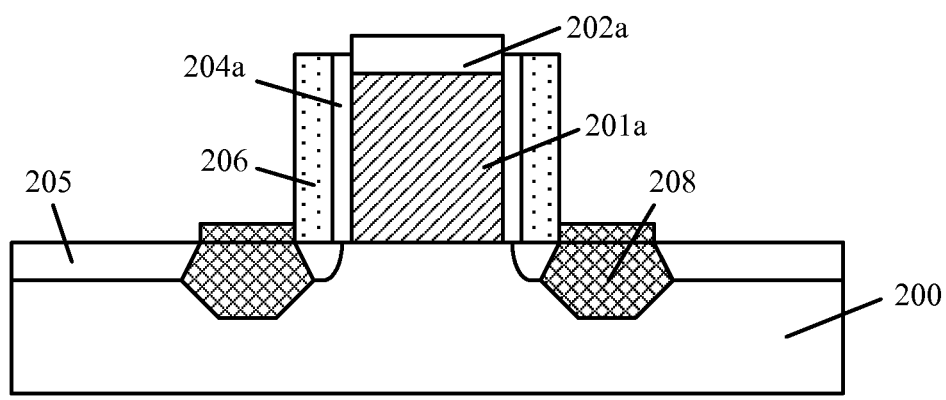
Figure 15:
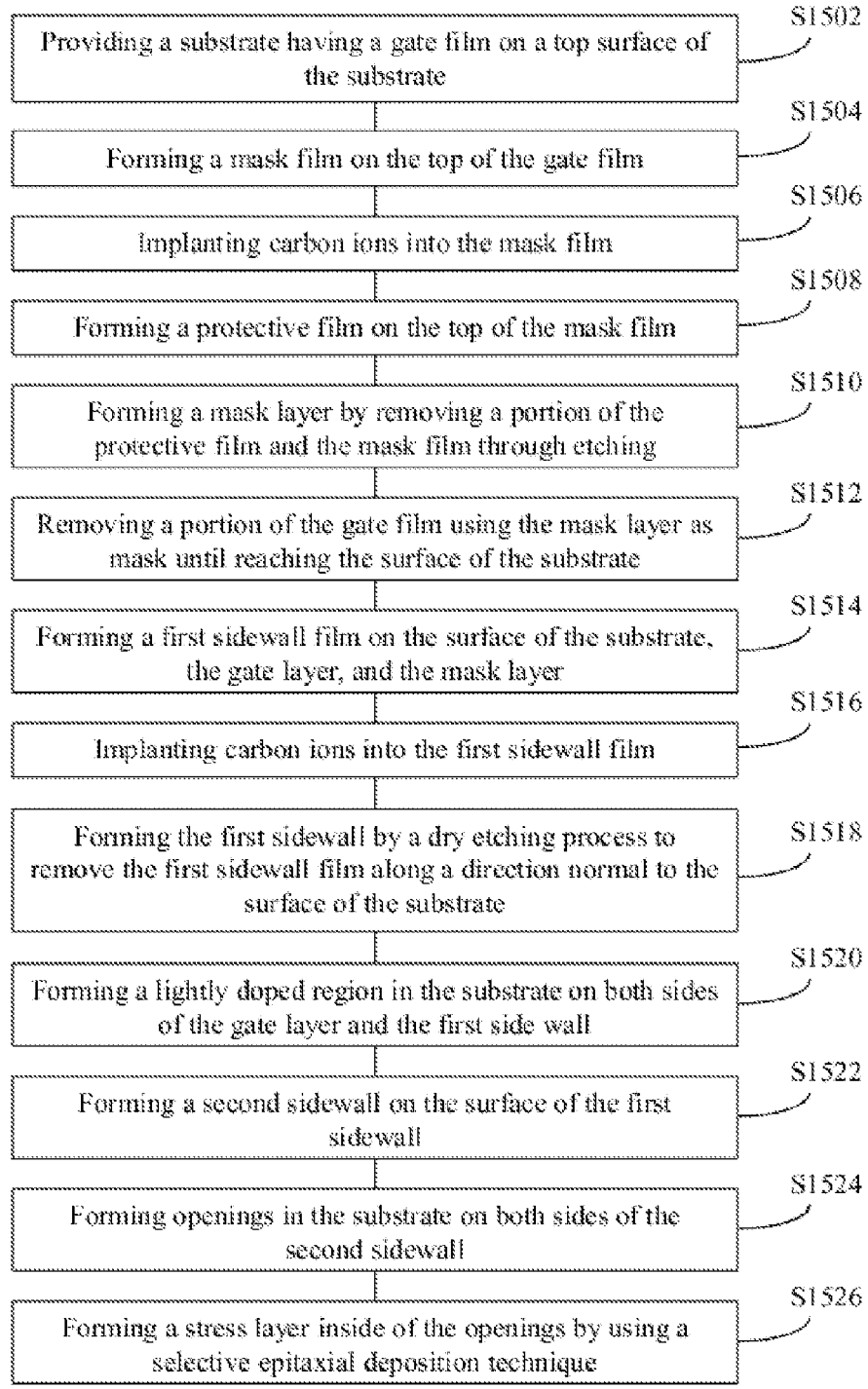
FIG. 15 illustrates an exemplary fabrication process of a transistor consistent with the disclosed embodiments.

FIG. 15 illustrates an exemplary fabrication process of a transistor consistent with the disclosed embodiments. FIGS. 2~14 illustrate the cross-section views of the semiconductor structures corresponding to certain stages of the fabrication process of the transistor.

Figure 2:
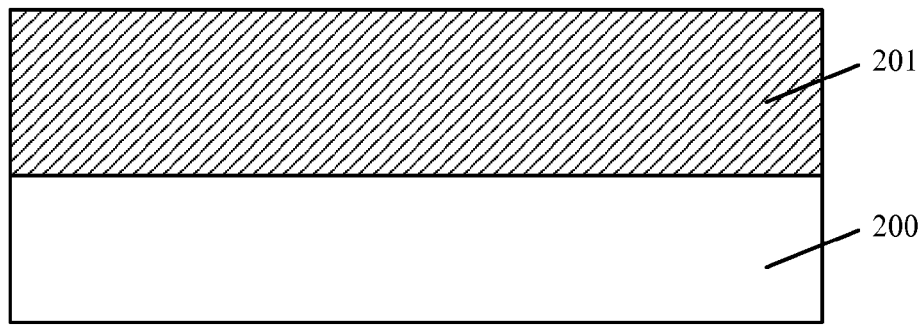
FIGS. 2-14 illustrate cross-section views of semiconductor structures corresponding to certain stages of an exemplary fabrication process of a transistor consistent with the disclosed embodiments.

As shown in FIG. 15, at the beginning of the fabrication process 1500 of the transistor, a semiconductor substrate is provided (S1502). FIG. 2 shows a corresponding structure.

Referring to FIG. 2, a substrate 200 is provided. A gate film 201 may be formed on a top surface of the substrate 200. The substrate 200 may be made of any appropriate materials, such as silicon, germanium, silicon germanium, silicon on insulator (SIO), or germanium on insulator (GOI), etc.

In one embodiment, the substrate 200 is made of silicon. Because a stress layer may be subsequently formed in the substrate on both sides of the gate layer and the stress layer may be made of SiGe or SiC, there is a lattice mismatch between the silicon substrate and the stress layer. Thus, the stress layer may induce stress in the substrate 200 under the gate layer. As such, the mobility of the carriers in the channel region under the gate layer may be improved.

Referring to FIG. 2, a gate film 201 may be formed on the top surface of the substrate 200. The gate film 201 may be used to form a gate layer following a subsequent etching process. The gate film 201 is made of polycrystalline silicon and the formation process may be chemical vapor deposition (CVD) or physical vapor deposition (PVD).

In one embodiment, the transistor to be formed is a high-K metal gate structure. The gate layer is formed as a dummy gate. A dummy gate is used to pre-occupy space for a subsequently-formed metal gate. The metal gate may be formed to replace the dummy gate in a subsequent process.

In one embodiment, after the formation of the gate film 201 on the top surface of the substrate 200, a high-K metal gate structure is formed. The formation process for the high-K metal gate structure further includes: removing the gate layer formed from the gate film 201 to expose the surface of the substrate 200 covered by the gate layer; forming a high-K gate dielectric layer (not shown) on the exposed surface of the substrate 200; finally, forming a metal gate (not shown) on the surface of the high-K gate dielectric layer.

In another embodiment, prior to the formation of the gate film 201, a gate dielectric film (not shown) may be formed on the top surface of the substrate 200. Then, the gate film 201 may be formed on the surface of the gate dielectric film. In certain embodiments, the gate dielectric film is made of SiO; the gate dielectric film is subsequently used to form a gate dielectric layer between the gate layer and the substrate 200 by etching; and the gate dielectric layer is used to protect the surface of the substrate 200 in a subsequent etching process to remove the gate layer.

In another embodiment, the gate dielectric film may be made of a high-K dielectric material, providing an alternative process to form the high-K metal gate structure. The process to form the high-K metal gate structure includes: forming a gate dielectric layer made of a high-K dielectric material by subsequently etching the gate dielectric film; removing the gate layer by etching until the surface of the gate dielectric layer, the high-K dielectric layer, is exposed; and further forming a metal gate on the surface of the high-K dielectric layer.

In certain other embodiments, after forming the gate dielectric film on the top surface of the substrate 200, a high-K dielectric film (not shown) may also be formed prior to the formation of the gate film 201. That is, the high-K dielectric film is formed between the gate dielectric film and the gate film 201. The high-K dielectric film is used to form a high-K dielectric layer in a subsequent etching process. After the removal of the gate layer by the subsequent etching process, the surface of the high-K dielectric layer is exposed and a metal gate may be formed on the surface of the high-K dielectric layer to complete the high-K metal gate structure.

In certain other embodiments, the gate layer formed by etching the gate film 201 serves as a gate for the formed transistor. Correspondingly, a gate dielectric-film may be formed between the gate film 201 and the substrate 200; and further, a gate dielectric layer may be formed by etching the gate dielectric film. The gate film 201 is made of polycrystalline silicon and the formation process may be CVD or PVD. The gate dielectric film is made of SiO and the formation process may be CVD or PVD.

Figure 3:
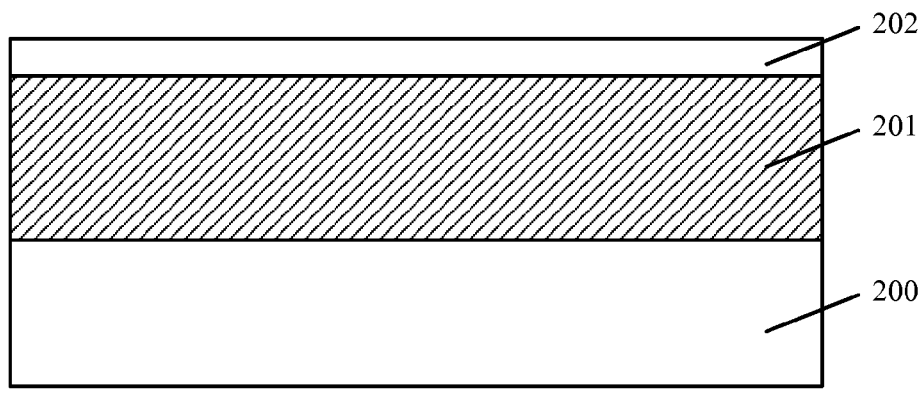

Returning back to FIG. 15, after forming the gate film 201, a mask film 202 may be formed on the top surface of the gate film 201 (S1504). FIG. 3 shows a corresponding structure.

The mask film 202 may be used to form a mask layer in a subsequent process. The mask layer may be used as a mask for etching the gate film 201. During subsequent processes to form a first sidewall, a second sidewall, and a stress layer, the mask layer may also be used to protect the top surface of the gate layer formed from the gate film 201 by etching, thus prevent the gate layer from being thinned down during subsequent processes and ensure the accuracy of the structure and the dimensions of the gate layer.

The mask film 202 may be made of one or more of SiN, SiO, SiON, and amorphous carbon, etc. In one embodiment, the mask film 202 is made of SiN. The formation process for the mask film 202 may be CVD, PVD, or atomic layer deposition (ALD).

The thickness of the mask film 202 may be in a range of 5 nm~100 nm. Because the mask layer formed from the mask film 202 by etching is used to protect the top surface of the gate layer in subsequent processes, the mask film 202 may need to be sufficiently thick to avoid the exposure of the top surface of the gate layer in subsequent processes due to excessive consumption of the mask layer during etching. In the meantime, the mask film 202 may not be too thick so that the accuracy of the graphic dimensions of the subsequently-formed mask layer may be ensured, thus the structural dimensions of the gate layer subsequently-formed by etching would be precise and easy to control. According to the present disclosure, when the thickness of the mask film 202 is in the range of approximately 5 nm~100 nm, the subsequently formed mask layer can not only protect the gate layer but also ensure the accuracy of the dimensions of the gate layer formed by etching.

As described above, a mask layer may be formed from the mask film 202 in a subsequent etching process and the mask layer is used to protect the top surface of a gate layer formed from the gate film 201 during the formation of a stress layer. However, during the subsequent selective epitaxial deposition process to form the stress layer, ions in the process gas may easily diffuse into the mask layer and further penetrate through the mask layer to contact with the gate layer, causing reaction between the ions in the process gas and the material used to form the gate layer. As a result EPI particles may be formed on the surface of the mask layer.

Figure 4:
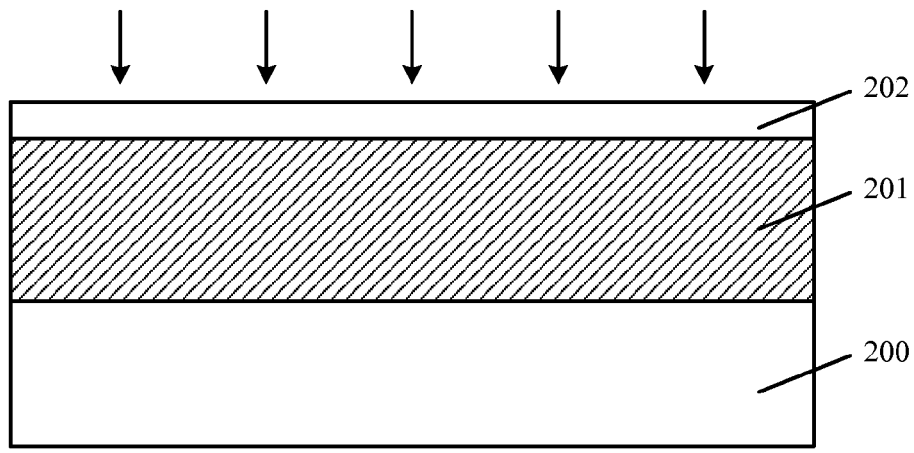

Returning to FIG. 15, carbon ions are implanted into the mask film 202 (S1506) to limit the diffusion of the ions in the process gas and thus prevent the ions from penetrating through the mask layer and reacting with the gate layer. A schematic illustration of the ion implantation, process is shown in FIG. 4.

In one embodiment, the stress layer to be formed in the substrate 200 is made of SiGe or SiC and the formation process is a selective epitaxial deposition process. The process gas of the selective epitaxial deposition process contains semiconductor ions such as silicon ions. According to the present disclosure, compared to the material of the gate film 201, semiconductor ions show a stronger bonding energy with carbon ions. Therefore, doping the mask layer with carbon ions may let the semiconductor ions in the process gas be preferentially bonded to carbon ions in the mask layer, and thus avoid the semiconductor ions penetrating through the mask layer and further reacting with the gate layer.

In one embodiment, carbon ions are implanted into the mask film 202 before the etching process to form the mask layer. During the ion implantation process, because the gate film 201 is fully covered by the mask film 202, the implanted carbon ions may not likely enter the gate film 201. Therefore, during a subsequent process to etch the exposed gate film 201 after the mask layer is formed by etching, the etching rate and the etching time may be easily controlled to ensure a good shape for the gate layer to be formed and also to avoid any damage to the surface of the substrate 200.

Further, because the surface of the substrate 200 is covered by the gate film 201 and the mask film 202, the implanted carbon ions may not likely enter the substrate 200, thus the formed transistor may have more stable performance as the properties of the subsequently-formed source region, drain region, and channel region are not affected by the carbon ions.

In certain other embodiments, carbon ions may be implanted into the mask layer after forming the mask layer from the mask film by etching but prior to further etching the gate film 201.

In one embodiment, the method to implant carbon ions into the mask film 202 includes: the amount of the implantation may be in a range of approximately 1E3 atoms/$cm^2$~1E6 atoms/$cm^2$; and the energy of the implantation may be in a range of approximately 5 keV~50 keV.

The amount of the implantation determines the concentration of the carbon ions in the mask film 202 and thus further determines the capability of the carbon ions in blocking the ions in the process gas during the subsequent process to form the stress layer. When the amount of implantation is in the range of approximately 1E3 atoms/$cm^2$~1E6 atoms/$cm^2$, the carbon ions in the mask layer may have a sufficient concentration to prevent the ions in the process gas, especially the semiconductor ions, from entering the mask layer; in the meantime, diffusion of carbon ions into the gate layer due to a high concentration of carbon ions may also be avoided. The energy of the implantation determines the depth that carbon ions may diffuse into the mask film 202. When the energy of the implantation is in a range of approximately 5 keV~50 keV, carbon ions are ensured to be implanted into the mask film 202 but not further into the gate film 201, thus a uniform etching rate in a subsequent process to etch the gate film 201 is ensured.

Figure 5:
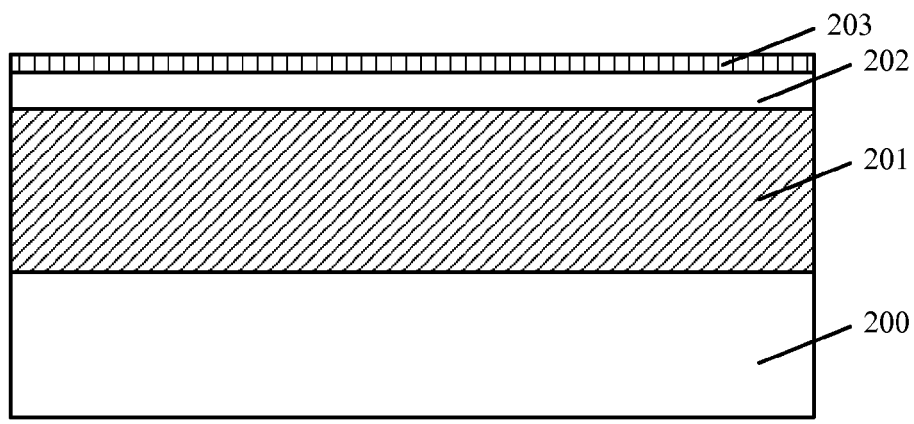

Returning back to FIG. 15, after implanting carbon ions into the mask film, a protective film 203 may be formed on the surface of the mask film 202 (S1508). FIG. 5 shows a corresponding structure.

The protective film 203 may be subsequently etched to form a protective layer. The protective layer is formed on the surface of the mask layer. The protective layer is used to protect the mask layer in a subsequent process to form the first sidewalk. Specifically, the existence of the protective layer not only prevents the thickness of the mask layer from being thinned down but also avoids the consumption of carbon ions in the mask layer due to the process used to form the first sidewall.

The protective film 203 may or may not be made of a same material used to form the mask film 202. In addition, the protective film 203 may or may not be made of a same material subsequently used to form the first sidewall.

In one embodiment, the protective film 203 is made of SiO. The formation process for the protective film 203 may be CVD, PVD, or ALD and the thickness of the protective film 203 may be in a range of approximately 5 nm~100 nm. With the thickness of the protective film 203 in a range of approximately 5 nm~100 nm, the protective layer formed from the protective film 203 is capable of protecting the subsequently-formed mask layer and, in the meantime, the protective film 203 is not too thick so that the accuracy of the dimensions of the subsequently-formed gate layer by etching are affected.

In another embodiment, the protective film is not formed, and the mask layer may be directly formed by etching the mask film 202 after implanting carbon ions into the mask film 202.

Figure 6:
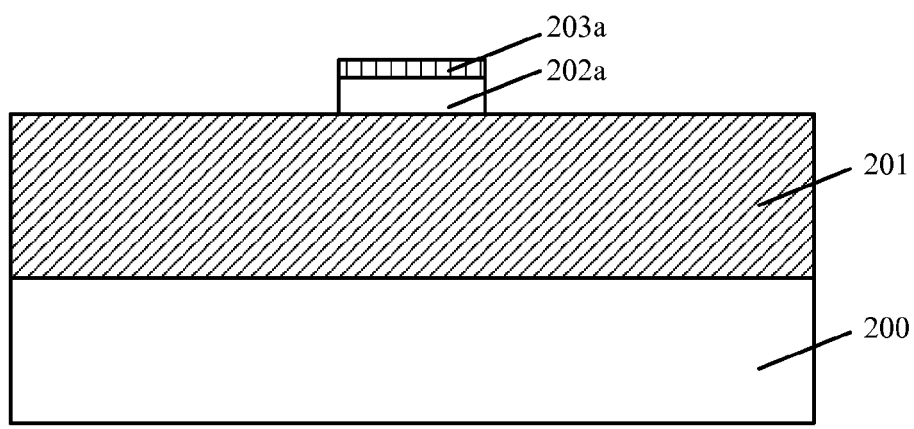

Returning back to FIG. 15, after the formation of the protective film 203 (shown in FIG. 5), a portion of the protective film 203 and the mask film 202 is removed by an etching process until the portion of the surface of the gate film 201 is exposed (S1510). FIG. 6 shows a corresponding structure.

As shown in FIG. 6, after the removal of the portion of the protective film 203 and the mask film 202, a mask layer 202a is formed on the surface of the gate film 201 while a protective layer 203a is formed on the surface of the mask layer 202a. Further, the mask layer 202a contains implanted carbon ions.

The formation process for the mask layer 202a includes forming a patterned photoresist layer on the surface of the protective film 203; etching the protective film 203 and the mask film 202 by using the photoresist layer as a mask until the surface of the gate film 201 is exposed to form the protective layer 203a and the mask layer 202a.

The pattern covered by the patterned photoresist layer is the projected area of the gate layer to be formed on the surface of the substrate 200. The formation process for the patterned photoresist layer includes coating a photoresist film on the surface of the protective film 203; and exposing and developing the photoresist film to form the patterned photoresist layer.

The method for etching the protective film 203 and the mask film 202 is an anisotropic dry etching process. The etching direction is perpendicular to the surface of the substrate 200 so that the pattern covered by the mask layer 202a is consistent with the patterned photoresist layer. Thus, the pattern covered by the mask layer 202a is the projected image of the gate layer to be formed on the surface of the substrate 200.

In another embodiment, the protective film is not formed on the surface of the mask film. The patterned photoresist layer may be directly formed on the surface of the mask film 202 and the etching process is only performed on the mask film 202.

Because carbon ions are implanted into the formed mask layer 202a and the bonding energy between the carbon ions and semiconductor ions are relatively strong, during the subsequent process to form the stress layer, the carbon ions can stop the diffusion of the semiconductor ions in the mask layer 202a. Thus, the reaction between the semiconductor ions in the process gas and the material of the subsequently-formed gate layer can be prevented and the formation of EPI particles on the surface of the mask layer 202a can be avoided.

Figure 7:
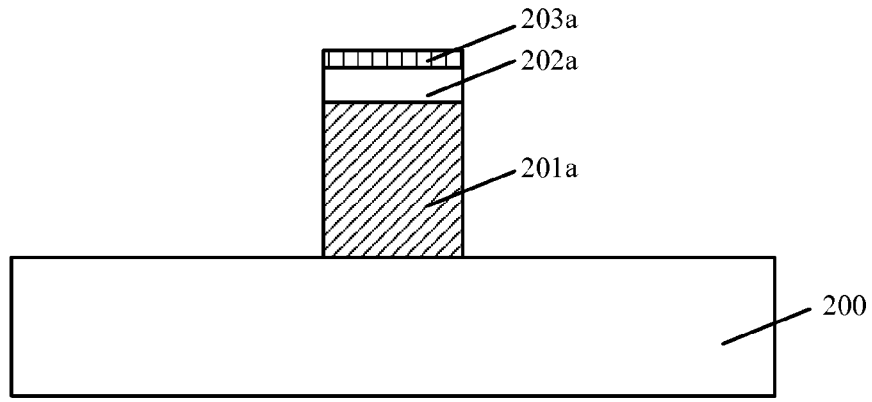

Returning back to FIG. 15, a gate layer 201a may be formed by etching the gate film 201 (shown in FIG. 6) using the mask layer 202a as a mask until the surface of the substrate 200 is exposed (S1512). FIG. 7 shows a corresponding structure.

The method for etching the gate film 201 may be an anisotropic dry etching process. The side surface of the formed gate layer 201a is perpendicular to the surface of the substrate 200. In one embodiment, the gate layer 201a is made of noncrystalline silicon. The etching process to form the gate layer 201a includes one or more of chlorine (Cl), hydrogen bromide (HBr), hydrogen chloride (HCl), and silicon chlorides (SiCl), etc. The flow rate of HBr, HCl, Or SiCl may be in a range of approximately 200 ml/min~200 ml/min while the flow rate of Cl may be in a range of approximately 20 ml/min~100 ml/min. In addition, the gas used for the etching process also includes carrier gas. The carrier gas may be any inert gas or nitrogen ($N_2$). The flow rate of the carrier gas may be in a range of approximately 50 ml/min~1000 ml/min and the pressure in the etching chamber may be in a range of approximately 2 mTorr~200 mTorr.

In one embodiment, the gate layer 201a may be formed as a dummy gate and is used to pre-occupy space for a subsequently-formed metal gate. After forming the stress layer, a high-K gate dielectric layer (not shown) and a metal gate (not shown) may be subsequently formed to replace the gate layer 201a.

In another embodiment, the gate layer 201a may be formed as a dummy gate and a gate dielectric film (not shown) may be formed between the substrate 200 and the gate film 201. The etching of the gate film 201 may be stopped at the surface of the gate dielectric film so that the gate dielectric film prevents damage to the surface of the substrate 200 during the etching process.

In another embodiment, a gate dielectric film, (not shown) may be formed between the substrate 200 and the gate film 201. The gate dielectric film may be made of SiO. After etching the gate film 201, a gate dielectric layer is formed by etching the gate dielectric film until the surface of the substrate 200 is exposed. The gate dielectric layer is the gate dielectric of the transistor to be formed while the gate layer 201a is the gate of the transistor.

Figure 8:
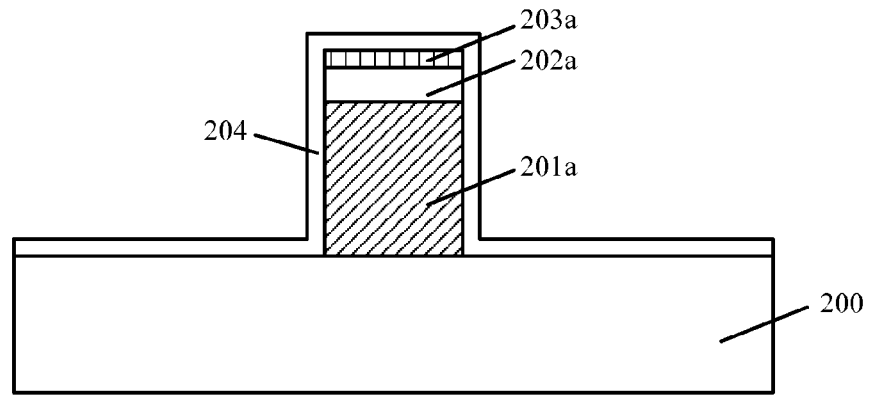

Returning back to FIG. 15, a first sidewall film 204 may be formed on the surface of the substrate 200, the gate layer 201a, and a mask layer 202a (S1514). FIG. 8 shows a corresponding structure.

The first sidewall film 204 may be used to form the first sidewall in a subsequent process. The first sidewall is used to protect the side surface of the gate layer 201a. In addition, the first sidewall film 204 is also used to define a position for a subsequently-formed lightly-doped region. In this manner, a large overlap area between the lightly-doped region and the gate layer 201a may be avoided so that large parasitic capacitance may not occur in the finally-formed transistor.

The first sidewall film 204 may be made of one or more of SiO, SiN, and SiON, etc. The formation process of the first sidewall film 204 may be CVS, PVD, or ALD. The thickness of the first sidewall film 204 may be in a range of approximately 5 nm~100 nm. In the one embodiment, the first sidewall film 204 is made of SiN.

The thickness of the first sidewall film 204 determines the thickness of the subsequently-formed first sidewall, and thus determines the relative position between the lightly-doped region and the gate layer 201a. The thickness of the first sidewall film 204 may not be too large so that the distance between the lightly-doped region and the gate layer 201a is sufficient to limit leakage current. The thickness of the first sidewall film 204 may not be too small; otherwise the overlap area between the lightly-doped region and the gate layer 201a is too large, causing large parasitic capacitance in the formed transistor.

The first sidewall is used to protect the side surface of the gate layer 201a. However, in a subsequent epitaxial deposition process to form a stress layer, the ions in the process gas may easily enter the first sidewall and further penetrate through the first sidewall to contact with the gate layer 201a. After the reaction between the ions in the process gas and the material of the gate layer 201a, EPI particles may be formed on the surface of the first sidewall. Particularly, EPI particles may be easily formed on the top surface of the sidewall next to the mask layer 202a. The EPI particles may cause a leakage current on the top of the gate of the formed transistor, leading to degradation of the performance of the formed transistor. Thus, Carbon ions may be subsequently implanted into the first sidewall film 204 to prevent the diffusion of the semiconductor ions of the process gas and further avoid the semiconductor ions from penetrating through the first sidewall and reacting with the gate layer 201a.

Figure 9:
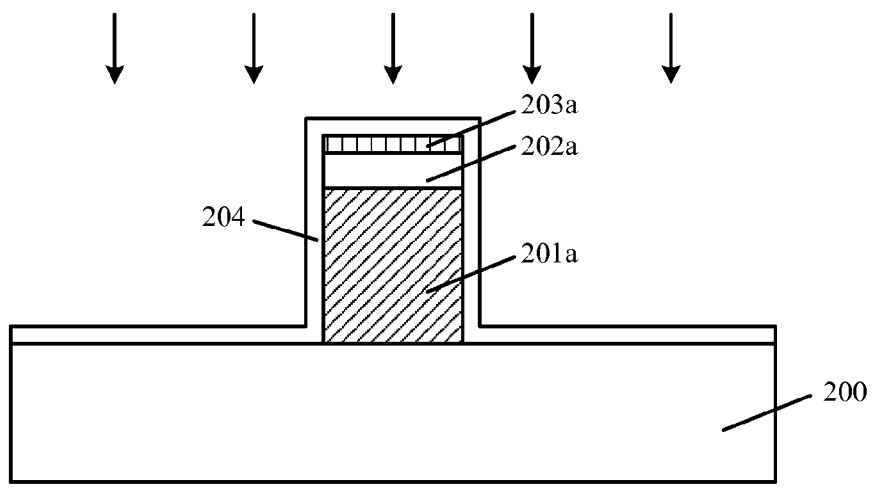

Referring to FIG. 15, carbon ions may be implanted into the first sidewall film 204 (S1516). FIG. 9 shows a corresponding structure.

In one embodiment, the stress layer subsequently-formed in the substrate 200 may be made of SiGe or SiC and the formation process for the stress layer is a selective epitaxial deposition process. In the selective epitaxial deposition process, the process gas contains semiconductor ions, for example, silicon ions. Compared to the material of the gate layer 201a, semiconductor ions have a stronger bonding energy with carbon ions. Therefore, after implanting carbon ions into the first sidewall film 204, the semiconductor ions in the process gas are preferentially bonded with the carbon ions in the first sidewall in the subsequent process to form the stress layer, thus avoiding the problem that semiconductor ions penetrate through the first sidewall and further react with the gate layer 201a and preventing the formation of EPI particles on the surface of the first sidewall. As such, the performance of the formed transistor becomes stable and the reliability is also improved.

In one embodiment, prior to etching back the first sidewall film 204, carbon ions may be implanted into the mask film 202. Because the surface of the substrate 200 is also covered by the first sidewall film 204, the carbon ions unlikely enter the substrate 200, resulting in more stable properties for the source region, the drain region, and the channel region subsequently formed in the substrate 200.

Further, the process to implant carbon ions into the first sidewall film 204 includes: the amount of the implantation may be in a range of approximately 1E3 atoms/$cm^2$~1E6 atoms/$cm^2$; the energy of the implantation may be in a range of approximately 5 keV~50 keV. The amount of the implantation determines the concentration of the carbon ions in the first sidewall film 204, and thus further determines the capability of the carbon ions in blocking the ions in the process gas during the subsequent process to form the stress layer. When the amount of implantation is in the range of approximately 1E3 atoms/$cm^2$~1E6 atoms/$cm^2$, the carbon ions in the mask layer may have a sufficient concentration to prevent the ions, especially the semiconductor ions, in the process gas from entering the first sidewall; also, diffusion of carbon ions into the gate layer 201a due to a high concentration of carbon ions may also be avoided. The energy of the implantation determines the depth that carbon ions may diffuse into the first sidewall film 204. When the energy of the implantation is in a range of approximately 5 keV~50 keV, carbon ions may be ensured to be implanted into the first sidewall film 204 but not further into the gate film 201.

In one embodiment, a metal gate may be subsequently formed to replace the gate layer 201a, thus the above implantation process ensures a uniform etching rate in the subsequent process to remove the gate layer 201a, in another embodiment, the gate layer 201a is the gate of the finally-formed transistor, thus the above implantation process ensures stable performance of the gate layer 201a.

Figure 10:
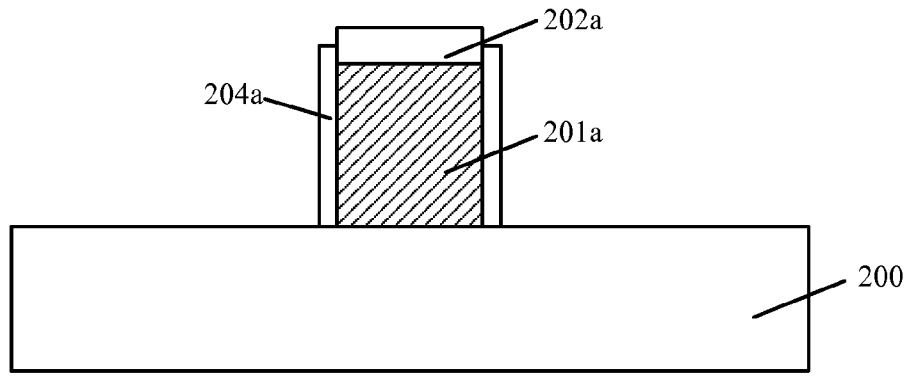

Returning back to FIG. 15, after the ion implantation process, a first sidewall 204a may be formed (S1518). More specifically, the first sidewall 204a may be formed on the side surface of the gate layer 201a and the mask layer 202a by etching back the first sidewall film 204 (shown in FIG. 9) until the surface of the substrate 200 is exposed. The first sidewall 204a is implanted with carbon ions. FIG. 10 shows a corresponding structure.

In one embodiment, the protective layer 203a (shown in FIG. 9) may be removed either during etching back the first sidewall film 204 or after etching hack the first sidewall film 204.

The method for etching back the first sidewall film may be an anisotropic dry etching process. The etching direction is perpendicular to the surface of the substrate 200 so that the etching back process can remove the mask layer 202a and the part of the first sidewall film 204 on the surface of the substrate 200, leaving the remained part of the first sidewall film 204 on the side surface of the gate layer 201a to form the first sidewall 204a.

The anisotropic dry etching process includes: a temperature is in a range of approximately 20° C.~80° C. and a pressure is in a range of approximately 5 mTorr~50 mTorr.

The etching gas may contain one or more of $CF_4$, $CH_3F$, and $CHF_3$, etc. The etching gas may also contain oxygen and a carrier gas. The carrier gas may be nitrogen or any inert gas. The flow rate of the etching gas is in a range of approximately 20 sccm~200 sccm.

Figure 11:
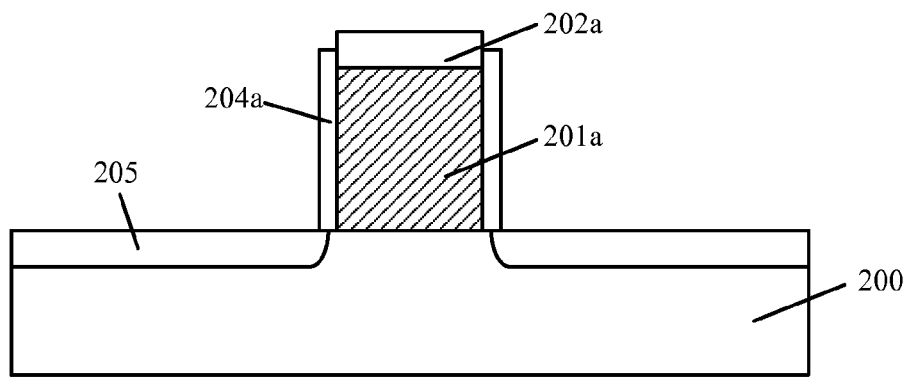

Referring to FIG. 15, after the formation of the first sidewall 204a, a lightly-doped region 205 may be formed in the substrate 200 on both sides of the gate layer 201a and the first sidewall 204a (S1520). FIG. 11 shows a corresponding structure.

The lightly-doped region 205 may be formed by an ion implantation process. The implanted ions may be either p-type or n-type ions. When the transistor to be formed is a PMOS transistor, the implanted ions may be p-type such as boron ions or indium ions. When the transistor to be formed is a NMOS transistor, the implanted ions may be n-type such as phosphorous ions or arsenic ions. The concentration of the doped ions in the lightly-doped region 205 is lower than that in the subsequently-formed source region and drain region to prevent the doped ions in the source region and the drain region from diffusion, and thus to reduce the leakage current and prevent the emerging of the short channel effect.

Figure 12:
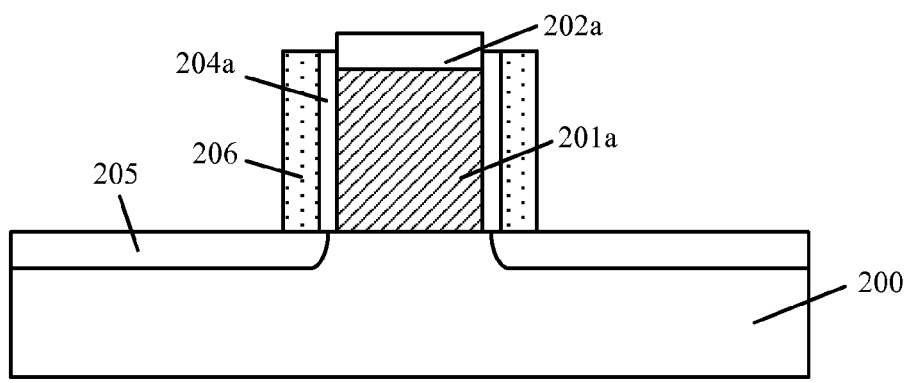

Returning back to FIG. 15, after forming the lightly-doped region 205, a second sidewall 206 may be formed on the surface of the first sidewall 204a (S1522). FIG. 12 shows a corresponding structure.

In one embodiment, a second sidewall 206 may be formed on the side surface of the first sidewall 204a. The second sidewall 206 is used to define the relative position between the subsequently-formed stress layer and the gate layer 201a. In certain other embodiments, the second sidewall 206 is not formed such that, after the formation of the first sidewall 204, a stress layer may be directly formed.

The formation process for the second sidewall 206 further includes: forming a second sidewall film on the surface of the substrate 200, the first sidewall 204a, and the mask layer 202a; and etching back the second sidewall film until the surface of the substrate 200 is exposed to form the second sidewall 206.

The formation process for the second sidewall film may be CVD, PVD, or ALD. The material of the second sidewall film may be different from the material of the first sidewall 204a or the mask layer 202a to avoid damage to the first sidewall 204a and the mask layer 202a during etching back the second sidewall film. In one embodiment, the second sidewall film may be made of one or more of SiO, SiN, and SiOH, etc.

The thickness of the second sidewall film is in a range of approximately 5 nm~100 nm. The thickness of the second sidewall film determines the thickness of the subsequently-formed second sidewall 206, and thus determines the relative position between the stress layer and the gate layer 201a. The thickness of the second sidewall film may not be too large so that the stress layer may provide sufficient stress in the channel region of the transistor. In the meantime, the thickness of the second sidewall film may not be too small either; otherwise, the second sidewall film may induce an overlap area between the stress layer and the gate layer 201a, resulting in large parasitic capacitance in the formed transistor.

The method for etching back the second sidewall film is an anisotropic dry etching process. The etching direction is perpendicular to the surface of the substrate 200 so that the etching back process can remove the mask layer 202a and the part of the second sidewall film on the surface of the substrate 200, leaving the remained part of the second sidewall film on the side surface of the first sidewall 204a to form the second sidewall 206.

In one embodiment, after forming the second sidewall film but prior to etching back the second sidewall film, carbon ions may be implanted into the second sidewall film so that the second sidewall formed subsequently contains implanted carbon ions. The process to implant carbon ions into the second sidewall film includes: the amount of the implantation may be in a range of approximately $1E3$ atoms/cm$^2$~$1E6$ atoms/cm$^2$; the energy of the implantation may be in a range of approximately 5 keV~50 keV. Implanting carbon ions into the second sidewall film may further avoid the problem due to reaction between the semiconductor ions in the process gas and the gate layer 201a during the subsequent process to form the stress layer, thus preventing the formation of EPI particles on the surface of the second sidewall 206 and leading to more stable performance of the formed transistor.

Figure 13:
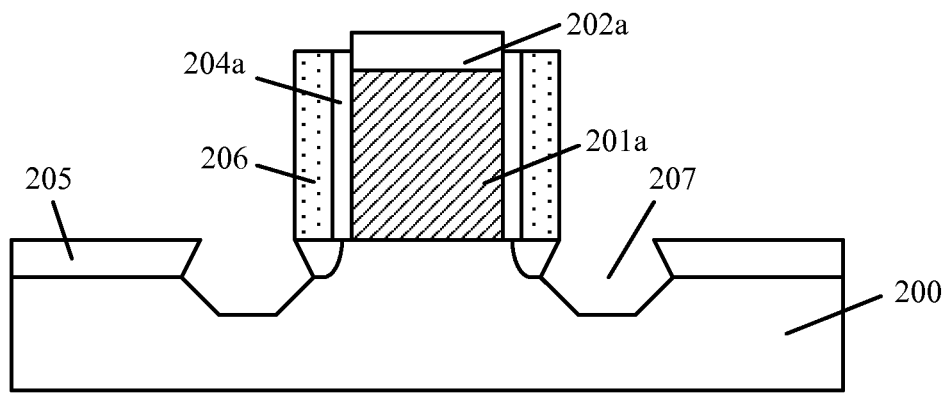

Referring to FIG. 15, on each side of the second sidewall 206, the first sidewall 204a, and the gate layer 201a, openings 207 may be formed in the substrate 200 (S1524). FIG. 13 shows a corresponding structure.

Referring to FIG. 13, an opening 207 is formed in the substrate 200 on each side of the second sidewall 206, the first sidewall 204a, and the gate layer 201a. The two openings 207 are used to form the stress layer in a subsequent process.

In one embodiment, the sidewall of each opening 207 and the surface of the substrate 200 may form a 'Σ' or Sigma shape. The sidewall of each opening 207 has a vertex angle. The vertex angle extends into substrates 200 under the gate layer 201a. The distance between a stress layer formed in the opening 207 and the gate layer 201a may be short so that the channel region under the gate layer 201a may obtain stronger stress, promoting the enhancement of the mobility of carriers and thus improving the performance of the formed transistor.

The formation process for the openings 207 includes using an anisotropic dry etching process to etch the substrate 200 on both sides of the structure consisting of the mask layer 202a, the first sidewall 204a, and the second sidewall 206. Two openings 207 are formed in the substrate 200 following the anisotropic dry etching process. The sidewall of each opening is perpendicular to the surface of the substrate 200. The formation process for the opening 207 also includes using an anisotropic wet etching process to further etch the sidewall and the bottom of the initial openings formed by the anisotropic dry etching process. The surface of the substrate 200 and the sidewall of each opening 207 formed after the application of the anisotropic wet etching process form a 'Σ' shape.

The anisotropic dry etching process includes: an etching gas includes Cl, HBr, or a mixture of Cl and HBr and a carrier gas includes an inert gas. The flow rate of HBr may be in a range of approximately 200 sccm~800 sccm. The flow rate of Cl may be in a range of approximately 20 sccm~100 sccm. The flow rate of inert gas may be in a range of approximately 50 sccm~1000 sccm. The pressure of etching chamber may be in a range of 2 mTorr~200 mTorr and the etching time may be in a range of approximately 15 s~60 s.

Further, the anisotropic wet etching process used to complete the formation of the openings 207 includes: an etching solution includes an alkaline solution, which may include one or more of potassium hydroxide (KOH), sodium hydroxide (NaOH), lithium hydroxide (LiOH), ammonia (NH$_4$OH), and tetramethyl ammonium hydroxide (TMAH), etc.

In one embodiment, the surface crystal orientation of the substrate 200 is along the <100> or the <110> direction. The anisotropic wet etching process has a relatively fast etching rate when the etching is along a direction either parallel or perpendicular to the surface of the substrate 200. The etching rate along the <111> direction is the slowest. Therefore, the anisotropic wet etching leads to forming a 'Σ' shape by the sidewall of the openings 207 and the surface of the substrate 200.

In another embodiment, the sidewall of the openings is perpendicular to the surface of the substrate. The formation process for the openings is an anisotropic dry etching process. Therefore, the process to form the openings is simple, saving time and cost.

Referring to FIG. 15, a stress layer 208 may be formed inside the openings 207 (shown in FIG. 13) by using a selective epitaxial deposition process (S1526). FIG. 14 shows a corresponding structure.

In one embodiment, a second side wall 206 is formed on the surface of the first sidewall 204a. The stress layer 208 is formed in the substrate 200 on both sides of the second sidewall 206, the first sidewall 204a, and the gate layer 201a.

In certain other embodiments, the second sidewall 206 is not formed, thus the stress layer 208 is formed in the substrate 200 on both sides of the first sidewall 204a and the gate layer 201a.

The top surface of the stress layer 208 is higher than or leveled with the surface of the substrate 200. In one embodiment, the surface of the stress layer 208 is higher than the surface of the substrate 200. The part of the stress layer 208 above the surface of the substrate 200 is used to form a metal silicide layer. The metal silicide layer is used as an electric contact layer for the source region and the drain region of the transistor.

The stress layer 208 may be made of SiGe or SiC and formed by a selective epitaxial deposition process. When the transistor to be formed is a PMOS transistor, the stress layer 208 is made of SiGe and implanted with p-type ions. When the transistor to be formed is a NMOS transistor, the stress layer 208 is made of SiC and implanted with n-type ions.

The selective epitaxial deposition process includes; a temperature is in a range of approximately 500° C.~800° C. and a pressure is in a range of approximately 1 Torr~100 Torr. The process gas includes HCl and H$_2$. The flow rate of HCl may be in a range of approximately 1 sccm~1,000 sccm while the flow rate of H$_2$ may be in a range of approximately 1 sccm~50,000 sccm.

In one embodiment, the stress layer 208 is made of SiC, thus the selective epitaxial deposition process may include a silicon-source gas such as SiH$_4$ or SiH$_2$Cl$_2$ and a carbon-source gas such as CH4, CH$_3$Cl or CH$_2$Cl$_2$. The flow rate of the silicon-source gas and the carbon-source gas may be in a range of approximately 1 sccm~1000 sccm.

In another embodiment, the stress layer 208 is made of SiGe, thus the selective epitaxial deposition process may include a silicon-source gas such as SiH$_4$ or SiH$_2$Cl$_2$ and a germanium-source gas such as GeH$_4$. The flow rate of the silicon source gas or the germanium source gas may be in a range of approximately 1 sccm~1000 sccm.

In one embodiment, during the selective epitaxial deposition process, when the silicon ions generated by the silicon-source gas diffuse into the mask layer 202a and the first sidewall 204a, because both the mask layer 202a and the first sidewall 204a contain implanted carbon ions and the carbon ions have a relatively large bonding energy with the silicon ions, the silicon ions diffused into the mask layer 202a and the first sidewall 204a are preferentially bonded to the carbon ions, forming stable carbon-silicon bonds, instead of penetrating through the mask layer 202a and the first sidewall 204a and further reacting with the gate layer 201a. As such, the problem that EPI particles formed on the surface of the first sidewall 204a and the mask layer 202a is avoided, thus leakage current in the formed transistor is suppressed while the performance and the reliability of the formed transistor are both improved.

In one embodiment, during the formation of the stress layer 208 by using the selective epitaxial deposition process, an in-situ doping process may also be applied to form a source region and a drain region in the stress layer 208. The in-situ doping process may control the distribution and the concentration of the doped ions in the source region or the drain region, thus avoiding diffusion of the eloped ions and suppressing the short channel effect.

In another embodiment, after forming the stress layer 208, using an ion implantation process, a source region (not shown) and a drain region (not shown) may be formed in the stress layer 208 and the part of the substrate 200 on both sides of the gate layer 201a. The implanted dopant ions may be either n-type or p-type.

In one embodiment, the transistor to be formed is a high-K metal gate transistor. Therefore, after forming the source region and the drain region, a dielectric layer may be formed on the surface of the substrate 200. The surface of the dielectric layer may be leveled with the surface of the gate layer 201a. An opening may be formed in the dielectric layer, after removing the mask layer 202a and the gate layer 201a. Further, a high-K gate dielectric layer may be formed on the bottom surface of the opening and then a metal gate may be formed on the surface of the high-K gate dielectric layer to fill the opening.

Therefore, according to the disclosed methods and structures, carbon ions may be implanted into a mask layer on the top of a gate film. Using the mask layer as the mask, a gate layer may be formed by etching through the gate film until reaching the substrate. After forming the gate layer, a first sidewall implanted with carbon ions may be formed on the side surface of the gate layer and the mask layer. Because of the relative strong banding energy between the carbon ions and semiconductor ions, during a process to form a stress layer, semiconductor ions in the process gas are preferentially bonded, to carbon ions when they enter the mask layer and the first sidewall, thus the problem that semiconductor ions penetrate through the mask layer and the first sidewall and wither react with the gate layer may be avoided. Therefore, the disclosed methods may prevent forming EPI particles on the surface of the mask layer and the first sidewall, thus result in a desired structural appearance for the formed transistor. Moreover, with the disclosed structures, leakage current may be suppressed in the formed transistor, thus the performance of the transistor is stable and the reliability is improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a transistor, comprising:
   providing a substrate;
   forming a gate film on a surface of the substrate;
   forming a mask layer implanted with carbon ions on a surface of the gate film;
   forming a gate layer by etching the gate film using the mask layer as a mask until the surface of the substrate is exposed;
   forming a first sidewall implanted with carbon ions on a side surface of the gate layer and further only on a lower portion of a side surface of the mask layer implanted with the carbon ions; and
   forming a stress layer in the substrate on both sides of the gate layer and the first sidewall.

2. The method according to claim 1, wherein the formation of the mask layer with implanted carbon ions includes:
   forming a mask film on the surface of the gate film;
   implanting carbon ions into the mask layer; and
   forming the mask layer by etching the mask film until reaching the surface of the gate film.

3. The method according to claim 2, wherein:
   the mask film is made of silicon nitride; and
   the thickness of the mask film is in a range of approximately 5 nm-100 nm.

4. The method according to claim 2, wherein implanting carbon ions into the mask film includes:
   setting amount of the implantation in a range of approximately 1E3 atoms/cm$^2$-1E6 atoms/cm$^2$; and
   setting an energy of the implantation in a range of approximately 5 keV-50 keV.

5. The method according to claim 1, wherein forming the first sidewall with implanted carbon ions includes:
   forming a first sidewall film on the substrate, the gate layer, and the mask layer;
   implanting the carbon ions into the first sidewall film; and
   forming the first sidewall by etching back the first sidewall film until the substrate is exposed.

6. The method according to claim 5, wherein:
   the first sidewall film is made of silicon nitride; and
   the thickness of the first sidewall film is in a range of approximately 5 nm-100 nm.

7. The method according to claim 5, wherein implanting carbon ions into the first sidewall film includes:
   setting amount of the implantation in a range of 1E3 atoms/cm$^2$-1E6 atoms/cm$^2$; and
   setting an energy of the implantation in a range of 5 keV-50 keV.

8. The method according to claim 1, after forming the first sidewall, further including:
   forming lightly-doped regions in the substrate on both sides of the first sidewall before forming the stress layer, wherein the lightly-doped region contains either p-type ions or n-type ions.

9. The method according to claim 1, wherein forming the stress layer includes:
   forming openings in the substrate on both sides of the first sidewall and the gate layer; and
   forming a stress layer by using a selective epitaxial deposition process to fill the openings with the top surface of the stress layer higher than or leveled with the surface of the substrate.

10. The method according to claim 2, further including:
    forming a protective film on the surface of the mask film after the ion implantation process but before etching the mask film; and
    etching the protective film and the mask film to form the mask layer and also a protective layer on the surface of the mask layer.

11. The method according to claim 10, wherein:
    the protective film is made of silicon oxide; and
    the thickness of the protective film is in a range of approximately 5 nm-100 nm.

12. The method according to claim 1, further including:
    forming a second sidewall after forming the lightly-doped region, including:
    forming a second sidewall film on the surface of the substrate, the first sidewall, and the mask layer; and
    forming the second sidewall by etching back the second sidewall film until the substrate is exposed.

13. The method according to claim 12, wherein:
    the second sidewall film is made one or more of silicon oxide, silicon nitride, and silicon oxynitride; and
    the thickness of the second sidewall film is in a range of approximately 5 nm-100 nm.

14. The method according to claim 13, after forming the second sidewall film, further including:
    implanting carbon ions into the second sidewall film before etching back the second sidewall film.

15. The method according to claim 14, wherein implanting carbon ions into the second sidewall film includes:
    setting amount of the implantation in a range of 1E3 atoms/cm$^2$-1E6 atoms/cm$^2$; and
    setting an energy of the implantation in a range of approximately 5 keV-50 keV.

16. A transistor, comprising: a substrate; a gate dielectric layer formed on a top surface of the substrate; a gate layer formed on a surface of the gate dielectric layer; a mask layer implanted with carbon ions and formed on a top surface of the gate layer; a first sidewall implanted with carbon ions formed on a side surface of the gate layer and further only on a lower portion of a side surface of the mask layer implanted with the carbon ions; a second sidewall formed on the first sidewall, wherein the first side wall and the second sidewall cover only the lower portion of the side surface of the mask layer implanted with the carbon ions and the side surface of the gate layer; a stress layer formed in the substrate on both sides of the first sidewall and the gate layer; a lightly-doped region surrounding the stress layer in the top surface of the substrate on both sides of the first sidewall and the gate layer; a source region formed in the stress layer on one side of the gate layer; and a drain region formed in the stress layer on the other side of the gate layer.

17. The transistor according to claim 16,
    wherein the stress layer is formed in the substrate on both sides of the second sidewall, the first sidewall, and the gate layer.

18. The transistor according to claim 16, wherein:
    the gate dielectric layer is made of a high K dielectric material and the gate layer is made of a metal; or
    the gate dielectric layer is made of silicon oxide and the gate layer is made of polycrystalline Si.

19. A method for fabricating a transistor, comprising:
    providing a substrate;
    forming a gate film a surface of the substrate;
    forming a mask layer implanted with carbon ions on a surface of the gate film;
    forming a protective layer on the mask layer implanted with carbon ions;

using the protective layer and the mask layer implanted with carbon ions, as an etch mask to etch the gate film to form a gate layer;

forming a first sidewall film implanted with carbon ions on the substrate, the gate layer, the mask layer, and the protective layer;

performing an etching-back process to remove portions of the first sidewall film and to remove the protective layer, until the mask layer implanted with carbon ions and the substrate on both sides of the gate layer are exposed.

20. The method according to claim 19, further including:

forming a second sidewall film, implanted with carbon ions, on the first sidewall film, implanted with the carbon ions, wherein the step of performing an etching process further removes a portion of the second sidewall film, until the mask layer implanted with carbon ions and the substrate are exposed, to form a second sidewall on a side surface of the first sidewall.

* * * * *